United States Patent [19]

Razavi

[11] Patent Number: 5,574,405
[45] Date of Patent: Nov. 12, 1996

[54] LOW NOISE AMPLIFIER/MIXER/FREQUENCY SYNTHESIZER CIRCUIT FOR AN RF SYSTEM

[75] Inventor: Behzad Razavi, Aberdeen, N.J.

[73] Assignee: Lucent Technologies Inc., Murray Hill, N.J.

[21] Appl. No.: 517,935

[22] Filed: Aug. 22, 1995

[51] Int. Cl.$^6$ .................... H03B 5/24; H03L 7/07; H04B 1/26
[52] U.S. Cl. .................... 331/2; 331/8; 331/16; 331/57; 331/186; 327/105; 455/318; 455/333; 455/343
[58] Field of Search .................... 331/2, 8, 16, 18, 331/25, 37, 40, 41, 108 C, 116 R, 116 FE, 117 R, 117 FE, 117 D, 185, 186, 57; 327/105–107; 329/323–326, 358, 360; 455/131, 182.1, 183.1, 260, 313, 318–320, 323, 333, 343

[56] References Cited

U.S. PATENT DOCUMENTS

| | | | |
|---|---|---|---|
| 4,194,158 | 3/1980 | Tanabe et al. | 455/333 |
| 4,736,459 | 4/1988 | Zwarts | 455/333 X |
| 5,140,286 | 8/1992 | Black et al. | 331/186 X |
| 5,210,509 | 5/1993 | Greeff et al. | |
| 5,323,123 | 6/1994 | Philippe | 455/333 X |
| 5,361,044 | 11/1994 | Norimatu et al. | |
| 5,379,003 | 1/1995 | Bizen | 331/185 X |
| 5,428,837 | 6/1995 | Bayruns et al. | 455/318 X |

*Primary Examiner*—David Mis

[57] ABSTRACT

A low noise amplifier (LNA)/mixer/frequency synthesizer circuit for the front end of a RF system. The LNA/mixer/frequency synthesizer circuit is fabricated as an integrated circuit utilizing 0.6 μM CMOS technologies. The LNA within the circuit is provided a bias current from a power supply. Due to the CMOS construction of the LNA, a significant amount of unused power is available within the LNA. The frequency synthesizer requires the same bias current as does the LNA. The frequency synthesizer is directly coupled to the LNA, wherein the unused bias current of the LNA is used to supply the required bias current to the oscillators within the frequency synthesizer. Since the bias current used by the frequency synthesizer is drawn from the surplus of the LNA, a RF system front end is provided that has greatly reduced power requirements. The LNA is coupled to the frequency synthesizer, via an inductor. The inductor provides resonance to a node between the LNA and the frequency synthesizer that joins to the mixer. The inductor suppresses band harmonics while preserving the unused bias current.

20 Claims, 2 Drawing Sheets

LOW NOISE AMPLIFIER/MIXER/FREQUENCY SYNTHESIZER CIRCUIT FOR AN RF SYSTEM

RELATED APPLICATIONS

The matter set forth herein is related to the matter contained in co-pending U.S. patent application Ser. No. 08/513,195 filed Aug. 9, 1995, entitled FREQUENCY SYNTHESIZER and assigned to AT&T, the assignee herein. The disclosure provided within copending U.S. patent application Ser. No. 08/513,195, is herein incorporated into this disclosure by reference.

BACKGROUND OF THE INVENTION

1. Field of the Invention

The present invention relates primarily to a low noise amplifier/mixer circuit used in conjunction with a frequency synthesizer in the front end of a RF receiver system. More particularly, the present invention relates to low noise/mixer circuits that are coupled to a frequency synthesizer in a RF system in a manner that enables the bias current of the low noise amplifier to be reused for the bias current of the oscillators within the frequency synthesizer, thereby producing a circuit that is highly energy efficient and is readily adapted to monolithic integration.

2. Prior Art Statement

RF systems, such as those used for mobile telephones, are becoming more sophisticated every year. As the number of mobile telephones increases, the frequencies used to carry the mobile telephone signal are becoming increasingly tightly spaced. For example, the Groupe Speciale Mobile (GSM) system, which acts as a mobile telephone standard in Europe, operates with 124 channels at 200 kHz spacings. The more complex IS54 mobile telephone application, operates at 800 channels with only 30 kHz spacings. The tight channel spacings typically associated with mobile telephone systems require the transceiver within the mobile telephone to be able to transmit and receive signals on small bandwidths without creating or receiving interference outside of the target bandwidth.

Accompanying the increase in sophistication in the transmission and reception of mobile telephone signals has come a trend to make mobile telephones much smaller and lighter. One of the largest and heaviest components of a mobile telephone is the rechargeable battery pack. As telephones are made smaller and lighter, so are the battery packs. This typically means that the battery packs have less power and a shorter functional life in between recharges. Attempts have therefor been made in the prior art to produce RF front end components that have reduced power requirements. Such prior art is exemplified by U.S. Pat. No. 5,361,044 to Norimatu et al., entitled PHASE LOCKED LOOP FREQUENCY SYNTHESIZER.

One of the primary solutions used in creating mobile telephones that are small, lightweight and do not require a lot of power has been the increased use of monolithic integration within the circuitry of the telephone. Obviously by manufacturing a large number of required circuits on-chip, great savings can be produced in size, weight and power consumption. There are many technologies available for forming circuits using monolithic integration. However, digital CMOS integration processes are particularly advantageous because digital CMOS technologies offer both a mature design environment and a relatively rapid prototyping ability.

In the prior art, the use of monolithic integration in the front end of a RF system has been problematic due to sensitivity of such circuits to noise both within and outside the narrow bandwidths of the individual transmission channels. As mobile telephone systems become more sophisticated and the transmission channels more tightly spaced, noise concerns have become such a problem that it has inhibited the use of full integration. For instance, passive resonators (i.e. LC tanks) cannot be effectively manufactured using monolithic integration techniques. Consequently, integrated oscillators are manufactured without passive resonators, thereby producing a circuit that has a very large phase noise. Consequently, the use of integrated oscillators is typically limited to applications, unlike mobile telephone communications, where noise is less of a concern. A real need therefore exists in the art for a way to manufacture mobile telephone circuitry using monolithic integration in a manner that reduces noise to acceptable tolerances.

It is therefore an object of the present invention to provide an RF system front end that has reduced noise characteristics and can be manufactured using monolithic integration.

It is a further object of the present invention to provide a RF system front end having greatly reduced power requirements.

It is yet another object of the present invention to provide a low noise amplifier/mixer/frequency synthesizer circuit on the integrated level having reduced phase noise and band harmonics.

SUMMARY OF THE INVENTION

The present invention is a low noise amplifier (LNA)/mixer/frequency synthesizer circuit for the front end of a RF system. The LNA/mixer/frequency synthesizer circuit is fabricated as an integrated circuit utilizing 0.6 μM CMOS technologies. The LNA within the circuit is provided a bias current from a power supply. Due to the CMOS construction of the LNA, a significant amount of unused power is available within the LNA. The frequency synthesizer is designed to require the same bias current as does the LNA. The frequency synthesizer is directly coupled to the LNA, wherein the unused bias current of the LNA is used to supply the required bias current to the oscillators within the frequency synthesizer. Since the bias current used by the frequency synthesizer is drawn from the surplus of the LNA, a RF system front end is provided that has greatly reduced power requirements. The LNA is coupled to the frequency synthesizer, via an inductor. The inductor provides resonance to a node between the LNA and the frequency synthesizer that joins to the mixer. The inductor suppresses band harmonics while preserving the unused bias current. Feedthrough signals that pass from the frequency synthesizer to the LNA are suppressed by the configuration of the oscillators within the frequency synthesizers as well as by the operation of the mixer.

BRIEF DESCRIPTION OF THE DRAWINGS

For a better understanding of the present invention, reference is made to the following description of an exemplary embodiment thereof, considered in conjunction with the accompanying drawings, in which.

DETAILED DESCRIPTION OF THE PREFERRED EMBODIMENT

Although the present invention low noise amplifier/mixer/frequency synthesizer circuit can be used in any application where such a circuit is expected to achieve a low phase noise with low power consumption, the present invention is especially suited for use in the front end of an RF receiver or transceiver system. Accordingly, the present invention low noise amplifier/mixer/frequency synthesizer circuit will be herein described as part of a RF front end system. More specifically, the present invention low noise amplifier/mixer/frequency synthesizer circuit will be described as part of the front end of a mobile telephone that is part of the European Groupe Speciale Mobile (GSM) RF system that operates with 124 channels with 200 kHz spacings. Such an application is merely exemplary and is intended to represent the best mode contemplated for the invention.

Figure 1:
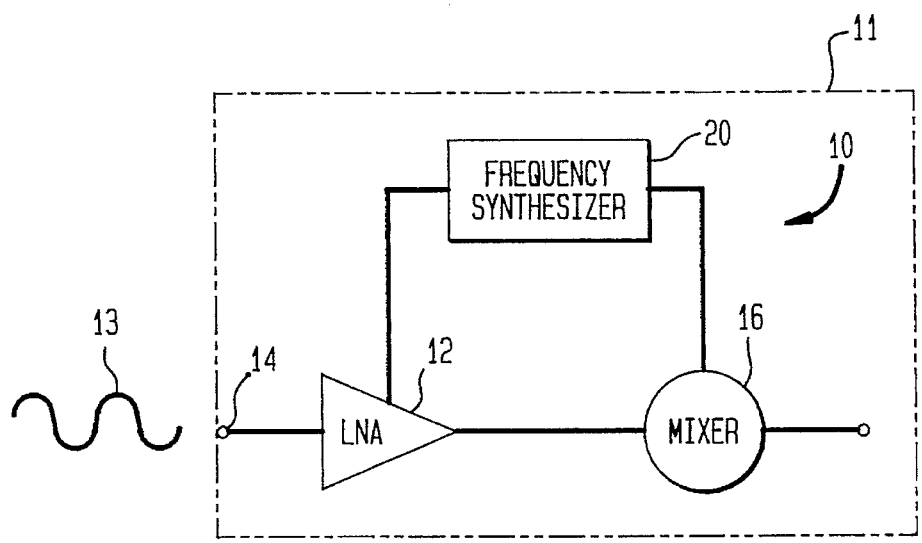
FIG. 1 is a block diagram schematic of the systems architecture of a preferred embodiment of the present invention low noise amplifier/mixer/frequency synthesizer circuit.

Referring to FIG. 1, the general architecture of the present invention low noise amplifier/mixer/frequency synthesizer circuit 10 is shown. The low noise amplifier/mixer/frequency synthesizer circuit 10 is part of the front end of a GSM RF system 11. As with prior art front ends, the low noise amplifier (LNA) 12 receives an RF signal 13 from an antenna port 14. The RF signal 13 is amplified by the LNA 12 and mixed, via the mixer 16, with the output of the frequency synthesizer 20. The mixing of the amplified RF signal with the output of the frequency synthesizer 20 demodulates the RF signal for use within the remainder of the RF system 11.

Figure 2:
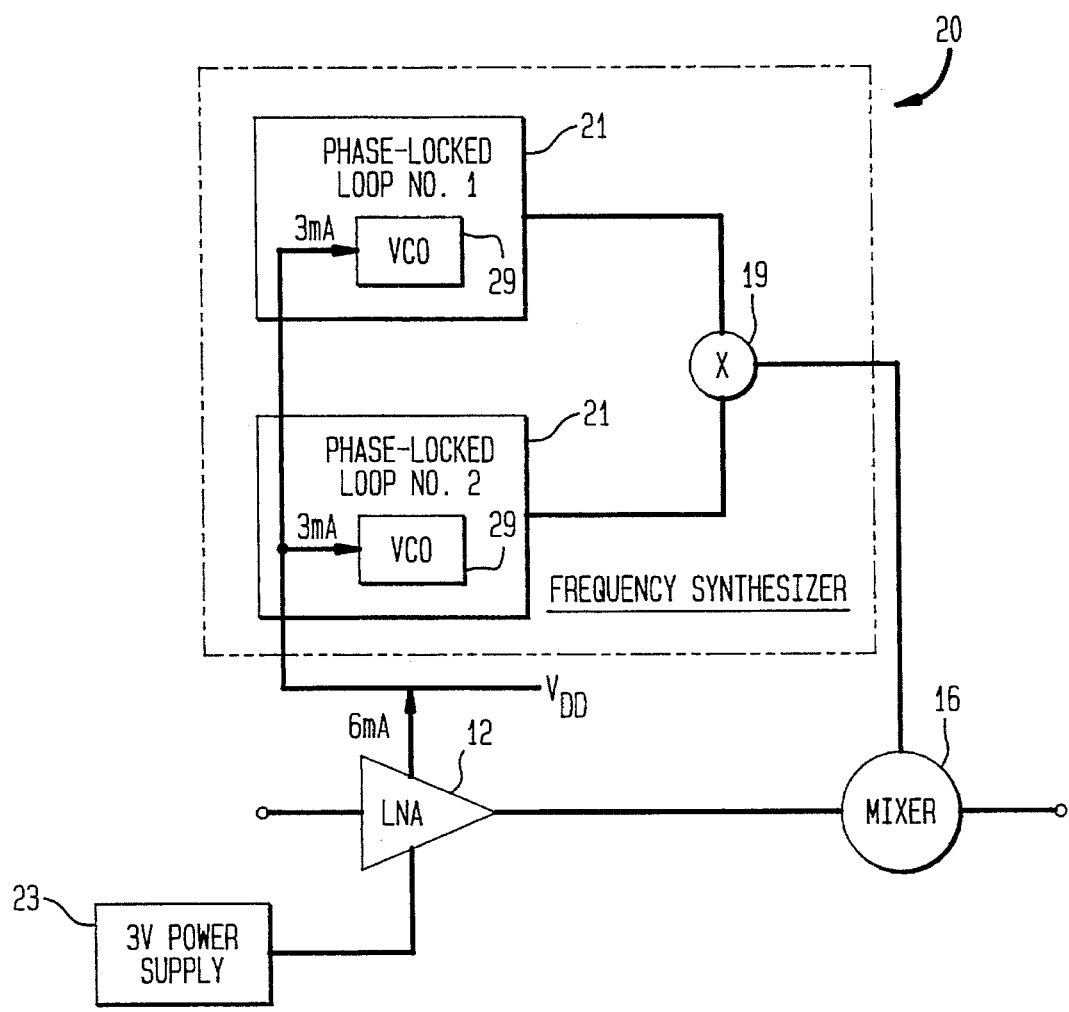
FIG. 2 is a block diagram schematic of the present invention showing a frequency synthesizer with two phase locked loops, wherein the low noise amplifier of the present invention is directly coupled to the voltage controlled oscillators contained within each of the loops.

In FIG. 2, it can be seen that the frequency synthesizer 20 contains two phase-locked loops 21. Each of the phase-locked loops contains a voltage controlled oscillator (VCR) 29 that is preferably a four stage ring oscillator. The output of each of the phase-locked loops 21 is mixed, via mixer 19, to produce a demodulation signal. The demodulation signal is mixed, via the mixer 16, with the RF signal that was amplified by the LNA 12, wherein the demodulation signal demodulates the RF signal. As is shown, the present invention circuit preferably operates from a 3 V power supply 23. As will later be explained, the LNA 12 requires a 6 mA bias current from the power supply 23. The frequency synthesizer 20 is also designed to require a 6 mA bias current, wherein each of the two oscillators 29 within the frequency synthesizer 20 require a 3 mA bias current. The oscillators 29 within the two phase-locked loops 21 of the frequency synthesizer 20 are coupled directly to the LNA 12, whereby the bias current of the LNA 12 is reused by the frequency synthesizer 20 producing significant power savings.

Figure 3:
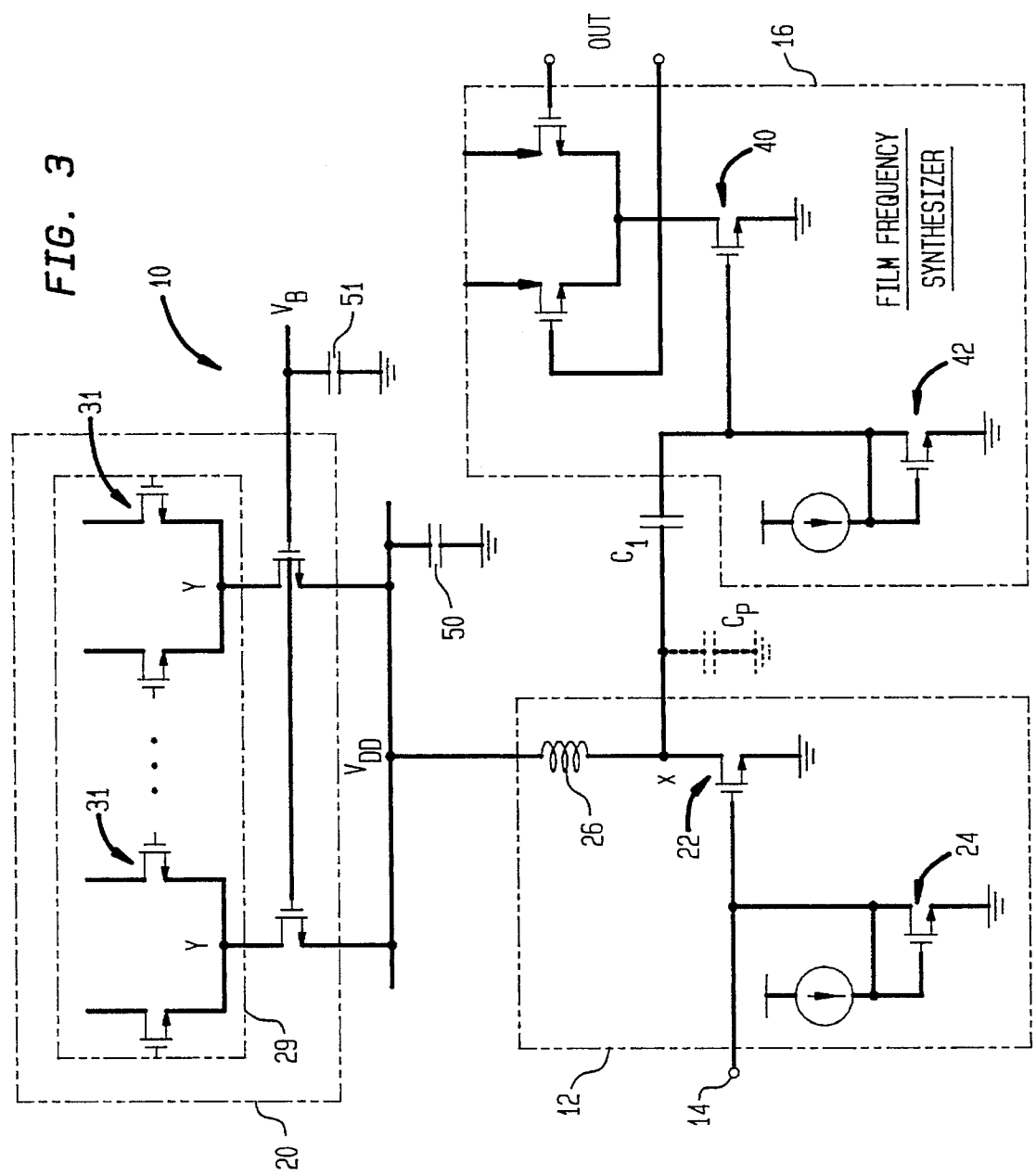
FIG. 3 is a schematic diagram showing the circuit components of the low noise amplifier and mixer, wherein the schematic also illustrates the interrelation of the low noise amplifier and mixer with the frequency synthesizer.

Referring to FIG. 3, it can be seen that the preferred embodiment of the LNA 12 includes a first transistor 22, wherein the gate of the first transistor 22 is coupled to the antenna port 14. The source of the first transistor is grounded, while the drain of the first transistor is coupled to node X. A current mirror circuit 24 is joined to the gate of the first transistor 22 so as to set a predetermined bias current to the first transistor 22. In the shown embodiment, the bias current is preferably about 6 mA.

The components of the LNA 12 are preferably manufactured utilizing 0.6 μM CMOS integration technologies. Utilizing such a monolithic integration, the first transistor 22 preferably has a width of approximately 1000 μM, thereby requiring a gate-source overdrive and minimum drain-source voltage of only about 150 mV for operation.

An inductor 26 couples node X to the frequency synthesizer 20. The inductor 26 may be an external component, but is preferably integrated on-chip with the remainder of the circuit. In the preferred embodiment, the inductor 26 has a value of 13 nH with a Q of approximately five. The preferred impedance of the first transistor 22 at the size described is less than 2 KΩ, thereby limiting the Q of the LNA 12 to approximately ten even if the inductor 26 were ideal.

The frequency synthesizer 20 is a circuit having two pulse-swallow phase-locked loops 21 (FIG. 2). Each of the phase-locked loops incorporates a four stage ring oscillator 29. Each stage of the four stage ring oscillators contains a differential transistor pair 31 that are required to be biased at approximately 0.75 mA. The tail currents of each of the differential pairs 31 are summed at node line $V_{DD}$. The voltage bias $V_B$ is set within each four stage ring oscillator 29 so that the tail currents at the node line $V_{DD}$ are approximately 0.5 V. The structure of the frequency synthesizer 20 is described in copending U.S. patent application Ser. No. 08/513,195, entitled FREQUENCY SYNTHESIZER, which is herein incorporated by reference so as to provide an enabling disclosure of the preferred embodiment of the frequency synthesizer 20.

The mixer 16 is comprised of a second transistor 40. The gate of the second transistor 40 is coupled to node X via capacitor $C_1$, the purpose of which will later be described. A current mirror circuit 42 is also coupled to the gate of the second transistor 40. The current mirror circuit 42 sets and maintains predetermined bias to the second transistor 40. The source of the second transistor 40 is grounded, while the drain of the second transistor 40 is coupled to a differential transistor pair 43, 44 that receive the output of the frequency synthesizer 20, wherein the mixer 16 mixes the output of the frequency synthesizer 20 with the amplified RF signal from the LNA 12.

The overall LNA/mixer/frequency synthesizer circuit 10 is manufactured utilizing CMOS technology and preferably operates at 900 MHz. The CMOS technologies currently used have no high-quality capacitors. As such, the capacitor $C_1$ coupling the gate of the second transistor 40 to node X, is implemented as a polysilicon-(metal 1)-(metal 2)-(metal 3) sandwich, with the polysilicon plate contributing a parasitic capacitance of $C_p$. The parasitic capacitance $C_p$ has a capacitance value that is equivalent to approximately half of the value of $C_1$ from node X to the base substrate. The existence of the parasitic capacitance $C_p$ is shown using broken lines in FIG. 3. While it is desirable to employ a wide device for the second transistor 40 to minimize its noise, the resulting input capacitance attenuates the signal, thereby mandating a large value for $C_1$ and hence the parasitic capacitance $C_p$. The larger values of capacitance $C_1$ and parasitic capacitance $C_p$ has the disadvantage of lowering the Q at node X. In the preferred embodiment, a optimal balance is achieved by providing a capacitance $C_1$ of approximately 1 pF and forming the second transistor 40 so that it has a length of approximately 200 μM and a bias current of about 1 mA.

The capacitance between node X and the second transistor 40 is tuned by the inductor 26, which provides a resonance at node X. Furthermore, the resonance at node X suppresses band harmonics, thereby improving the effective linearity of the LNA 12. The LNA 12 is AC-coupled to the mixer 16 through the capacitor $C_1$. An AC-coupling is necessary because the DC voltage at node X is not sufficient to trigger the second transistor 40 within the mixer 16.

The LNA 12 requires approximately 6 mA of bias current form the power supply. In the preferred embodiment, the power supply is a 3.0 V rechargeable battery. Although requiring the mentioned 6 mA of bias current, the LNA 12 can operate from a supply voltage of only 0.5 V. As has been previously explained, this is because the first transistor 22 in the LNA 12 is 1000 μM wide, thereby requiring a gate-source overdrive voltage of only 150 mV. Allowing a margin for the loss of a few hundred millivolts, including a 100 mV drop across the inductor 26, the first transistor 22 remains at saturation even when the voltage at the node line $V_{DD}$ drops to 0.5 V. In the preferred 3.0 V system, this leaves more than 2.0 V of unused headroom, which is the equivalent of approximately 12 mW in available power. Instead of wasting this surplus power, the present invention LNA/mixer/frequency synthesizer utilized this power to enable the frequency synthesizer 20.

As has been before mentioned, the frequency synthesizer 20 contains two phase-locked loops. Each of the phase-locked loops includes a four stage ring oscillator 29. Each stage of the four stage ring oscillator 29 contains a differential transistor pair 31 that requires a bias of 0.75 mA. Consequently, each of the four stage ring oscillators requires 3.0 mV to bias the four sets of differential transistor pairs 31 contained therein. The headroom required by each of the differential transistor pairs 31 is approximately 2 V. Consequently, the frequency synthesizer 20 coupled directly to the LNA 12 so as to reuse the surplus bias current from the LNA 12. The bias voltage required by the two phase-locked loops is approximately 6.0 mA, which is the same bias required by the LNA 12.

The direct coupling of the frequency synthesizer 20 to the LNA 12 in a manner so that the bias of the LNA 12 to be provided to the frequency synthesizer 20 does present some circuitry problems, wherein there is a feedthrough of signals from the oscillators 29 in the frequency synthesizer 20 back to the LNA 12. As each of the differential pairs 31 in the oscillators 29 switch states, the common source node Y experiences a voltage change. Occurring at twice the oscillation frequency, the voltage change is conducted to line node $V_{DD}$. As a result, the feedthrough does interfere with the LNA output signal to some extent. However, the feedthrough effects on the output of the LNA 12 do not have a significant detrimental effect. The four stage ring oscillators 29 in each phase-locked loop of the frequency synthesizer 20, each have a signal coupled to line node $V_{DD}$ and bias line $V_B$ that has a counterpart the is 180 degrees out of phase. A result is a first order cancellation of oscillator signals. To further limit the effects of feedthrough signals, bypass capacitors 50, 51 are connected to line node $V_{DD}$ and bias line $V_B$, respectively, to further suppress any residual feedthrough. Since the feedthrough signal appears at the output of the LNA 12, the effect of the feedthrough is lowered by the gain of the LNA 12, which is approximately 17 dB. Furthermore, since the frequencies of the two oscillators 29 are chosen such that their intermodulation product falls out of the band of interest, the feedthrough signal will not appear in the baseband after it is down converted by the mixer 16.

The LNA/mixer/frequency synthesizer circuit 10 achieves a noise figure of 3 dB with a total power dissipation of approximately 30 mW from a 3 V supply. It is the use of the inductor 26 between the LNA 12 and the frequency synthesizer that enable such an efficient power rating to be had. The inductor 26 embodies a low voltage headroom, which unlike resistors, enables the surplus headroom of the LNA 12 to be reused by the frequency synthesizer 20, thereby greatly reducing the overall power consumption of the circuit.

Although the present invention as described above represents the best mode of the invention for a given application, it should be understood that the embodiment described is merely exemplary. The present invention LNA/mixer/frequency synthesizer circuit can be modified by a person skilled in the art using functionally equivalent components and circuits. All such modifications and alternate embodiments are intended to be included within the scope of the present invention as defined by the appended claims.

What is claimed is:

1. An improved low noise amplifier/mixer/frequency synthesizer circuit for demodulating a RF signal in an RF system front end, comprising:

a frequency synthesizer for producing a demodulation signal, said frequency synthesizer containing at least one oscillator, wherein said oscillator requires a predetermined bias current;

a low noise amplifier for amplifying said RF signal, said low noise amplifier containing a bias current at least as large as said predetermined bias current, wherein said low noise amplifier is directly coupled to said frequency synthesizer and provides said predetermined bias current thereto;

a mixer coupled to said frequency synthesizer and said low noise amplifier, wherein said mixer mixes said RF signal as amplified by said low noise amplifier to said demodulation signal, thereby demodulating said RF signal.

2. The circuit according to claim 1, wherein said frequency synthesizer, said low noise amplifier and said mixer are CMOS integrated circuits.

3. The circuit according to claim 1, wherein an inductor is disposed between said low noise amplifier and said frequency synthesizer.

4. The circuit according to claim 1, further including at least one capacitor disposed between said low noise amplifier and said mixer.

5. The circuit according to claim 4 wherein said low noise amplifier is AC-coupled to said mixer.

6. The circuit according to claim 1 wherein said frequency synthesizer includes at least one oscillator that requires said predetermined bias current, wherein said low noise amplifier is coupled to said at least one oscillator providing said predetermined bias current thereto.

7. The circuit according to claim 6, wherein said low noise amplifier contains a first transistor and a voltage mirror circuit coupled to the gate of said first transistor, wherein said voltage mirror circuit supplies said predetermined bias to said first transistor and said common source transistor supplies said predetermined bias to said frequency synthesizer.

8. The circuit according to claim 7, wherein said first transistor is a 0.6 μM CMOS device that is at least 1000 μM wide to inhibit noise.

9. A front end of a RF system, comprising:
   a frequency synthesizer for producing a demodulation signal;
   an amplifier for amplifying a RF signal received by said RF system, wherein said amplifier is directly coupled to said frequency synthesizer and provides a predetermined bias current thereto;
   a mixer coupled to said frequency synthesizer and said amplifier for mixing said demodulation signal with said RF signal, thereby demodulating said RF signal.

10. The front end according to claim 9, wherein said frequency synthesizer includes at least one oscillator that requires said predetermined bias current for operation, and wherein said amplifier is coupled to said at least one oscillator, thereby providing said predetermined bias current thereto.

11. The front end according to claim 9, wherein said amplifier and said mixer are CMOS integrated circuits.

12. The front end according to claim 9, further including an inductor disposed between said frequency synthesizer and said amplifier.

13. The front end according to claim 9, further including suppression means for suppressing signal feedthrough from said frequency synthesizer to said amplifier.

14. The front end according to claim 12, further including at least one capacitor disposed between said amplifier and said mixer.

15. The front end according to claim 14, wherein said amplifier is AC-coupled to said mixer.

16. The front end according to claim 14, wherein the capacitance associated with said at least one capacitor is tuned out by said inductor.

17. The front end according to claim 14, wherein said at least one capacitor is a CMOS device having a predetermined capacitance value and a parasitic capacitance associated therewith that is generally equivalent to half of said predetermined capacitance value.

18. The front end according to claim 14, wherein said amplifier is a low noise amplifier containing a first CMOS transistor and a voltage mirror circuit coupled to the gate of said first CMOS transistor, wherein said voltage mirror circuit supplies said predetermined bias to said first CMOS transistor and said first CMOS transistor is coupled to said frequency synthesizer providing said predetermined bias thereto.

19. The front end according to claim 18, wherein said mixer includes a second CMOS transistor, wherein the gate associated with said second CMOS transistor is AC-coupled to said first CMOS transistor in said amplifier.

20. The front end according to claim 19 wherein said first CMOS transistor is approximately 1000 μM wide, and said second CMOS transistor is approximately 200 μM wide, whereby both said first CMOS transistor and said second CMOS transistor are manufactured from 0.6 μM CMOS technologies.

* * * * *